US010665620B2

(12) United States Patent
Park et al.

(10) Patent No.: US 10,665,620 B2
(45) Date of Patent: May 26, 2020

(54) DISPLAY DEVICE HAVING CRACK-SENSING LINE

(71) Applicant: Samsung Display Co., Ltd., Yongin-si (KR)

(72) Inventors: Sun Park, Suwon-si (KR); Ji Won Sohn, Seoul (KR); Su Yeon Yun, Seoul (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 16/407,714

(22) Filed: May 9, 2019

(65) Prior Publication Data

US 2019/0267407 A1 Aug. 29, 2019

Related U.S. Application Data

(63) Continuation of application No. 15/611,177, filed on Jun. 1, 2017, now Pat. No. 10,319,750.

(30) Foreign Application Priority Data

Sep. 28, 2016 (KR) ........................ 10-2016-0125107

(51) Int. Cl.

| H01L 27/12 | (2006.01) |
|---|---|
| H01L 51/00 | (2006.01) |
| H01L 51/52 | (2006.01) |
| G02F 1/13 | (2006.01) |
| G02F 1/1333 | (2006.01) |

(Continued)

(52) U.S. Cl.
CPC ........ H01L 27/1244 (2013.01); G02F 1/1309 (2013.01); H01L 27/1248 (2013.01); H01L 51/5246 (2013.01); *G02F 1/1368* (2013.01); *G02F 1/136286* (2013.01); *G02F 2001/13685* (2013.01); *G02F 2001/133388* (2013.01); *G02F 2001/136254* (2013.01);
(Continued)

(58) Field of Classification Search
CPC ... H01L 21/67288; H01L 22/34; H01L 23/58; H01L 27/1244; H01L 23/562; H01L 51/5246

See application file for complete search history.

(56) References Cited

U.S. PATENT DOCUMENTS

| 2014/0176844 A1* | 6/2014 | Yanagisawa .......... G02F 1/1309 349/43 |
|---|---|---|
| 2014/0306941 A1 | 10/2014 | Kim et al. |

(Continued)

FOREIGN PATENT DOCUMENTS

| KR | 10-2014-0122960 | 10/2014 |
|---|---|---|
| KR | 10-1473312 | 12/2014 |
| KR | 10-1519519 | 5/2015 |

*Primary Examiner* — Caridad Everhart
(74) *Attorney, Agent, or Firm* — H.C. Park & Associates, PLC

(57) ABSTRACT

A display device includes a substrate, an insulating layer, and a crack-sensing line. The substrate includes a display area having a plurality of pixels to display images, and a non-display area surrounding the display area. The insulating layer is disposed in the non-display area and includes a recess. The crack-sensing line is disposed in and extends along the recess, and electrically connected to at least one of the pixels. The recess is disposed at a surface or inside of the insulating layer, and extends along the non-display area.

20 Claims, 13 Drawing Sheets

(51) Int. Cl.
    *G02F 1/1368*    (2006.01)
    *G02F 1/1362*    (2006.01)
    *H01L 27/32*     (2006.01)

(52) U.S. Cl.
    CPC ...... *H01L 27/3258* (2013.01); *H01L 27/3262* (2013.01); *H01L 27/3276* (2013.01)

(56)         References Cited

U.S. PATENT DOCUMENTS

2014/0354558 A1    12/2014  Cho et al.
2016/0293884 A1 *  10/2016  Zhang ................ H05B 33/0896

* cited by examiner

DISPLAY DEVICE HAVING CRACK-SENSING LINE

CROSS-REFERENCE TO RELATED APPLICATION

This application is a Continuation of U.S. patent application Ser. No. 15/611,177, filed on Jun. 1, 2017, and claims priority from and the benefit of Korean Patent Application No. 10-2016-0125107, filed on Sep. 28, 2016, which is hereby incorporated by reference for all purposes as if fully set forth herein.

BACKGROUND

Field

The invention relates generally to display devices, and more particularly, to a display device that senses cracks in the display device and/or is resistant to cracking.

Discussion of the Background

When cracks are generated in the manufacturing process of a display device, moisture may be permeated into the display area of the display device. The moisture that is permeated due to the cracks may cause defects in the display device. Therefore, when cracks can be prevented from being generated in the display device or when the generated cracks can be sensed, it is possible to reduce defects in the display device.

The above information disclosed in this Background section is only for enhancement of understanding of the background of the inventive concepts, and, therefore, it may contain information that does not form the prior art that is already known in this country to a person of ordinary skill in the art.

SUMMARY

Display devices constructed according to the principles of the invention include a crack-sensing line capable of improving product yield by sensing cracks generated in the display device and/or preventing the display device from being designated as a defective device when only minute cracks are present that have substantially no influence on quality of the display device, and/or improving resistance against cracks by preventing propagation of the cracks generated in the display device.

Additional aspects will be set forth in the detailed description which follows, and, in part, will be apparent from the disclosure, or may be learned by practice of the inventive concepts.

According to one aspect of the invention, a display device includes a substrate including a display area having a plurality of pixels to display images, and a non-display area surrounding the display area; an insulating layer disposed in the non-display area and including a recess; and a crack-sensing line disposed in and extending along the recess, and electrically connected to at least one of the pixels, and wherein the recess is disposed at a surface or inside of the insulating layer, and extends along the non-display area.

The recess may have a quadrangular cross-sectional shape.

The recess may include a polygonal or curved protrusion.

The crack-sensing line may have a polygonal recess portion corresponding to the polygonal protrusion or a curved recess portion corresponding to the curved protrusion.

The display device may further include first lines and second lines. The pixels may be arranged in a matrix having row direction and a column direction, the first lines may be connected to first pixels arranged in the row direction, the second lines may be connected to second pixels arranged in the column direction, and the crack-sensing line may be electrically connected to at least one of the first pixels and the second pixels.

Each of the pixels may include one or more thin film transistors, each thin film transistor may include a gate electrode as a control terminal, a source electrode as an input terminal, an active layer as a channel unit, and a drain electrode as an output terminal, and the crack-sensing line may include the same material as that of at least one of the gate electrode, the source electrode, and the drain electrode.

The display device may further include a plurality of gate lines and a plurality of data lines intersecting each other, wherein the crack-sensing line is connected to at least one of the gate lines and the data lines.

The insulating layer may extend into the display area, at least one of the gate electrode, the source electrode, and the drain electrode may be disposed in an electrode recess positioned in the insulating layer, and the electrode recess may be positioned at a surface or inside of the insulating layer, and is positioned in the display area.

The display device may further include at least one protection line disposed adjacent to the crack-sensing line, wherein the protection line is disposed in a protection line recess positioned in the insulating layer.

The protection line recess may be positioned at a surface or inside of the insulating layer, and extends along the recess in the non-display area, and the protection line may extend along the recess.

The protection line may extend substantially parallel to the crack-sensing line.

Each of the pixels may include one or more thin film transistors, each thin film transistor may include a gate electrode as a control terminal, a source electrode as an input terminal, an active layer as a channel unit, and a drain electrode as an output terminal, and the protection line may include the same material as that of at least one of the gate electrode, the source electrode, and the drain electrode.

The at least one protection line may be electrically isolated.

The display device may further include at least one dam adjacent to the crack-sensing line, wherein the dam is disposed at a surface or inside of the insulating layer.

The dam may extend substantially parallel to the crack-sensing line.

Each of the pixels may include one or more thin film transistors, each thin film transistor may include a gate electrode as a control terminal, a source electrode as an input terminal, an active layer as a channel unit, and a drain electrode as an output terminal, and the dam may include the same material as that of at least one of the gate electrode, the source electrode, and the drain electrode.

The dam may include a plurality of dams disposed at opposite sides of the crack-sensing line.

The crack-sensing line may include a plurality of crack-sensing lines, and the at least one dam is disposed between the crack-sensing lines.

The at least one dam may be electrically isolated.

The recess may include a trench having a ditch-like shape.

Accordingly, exemplary embodiments of the invention provide a display device capable of improving product yield by sensing cracks generated in the display device and preventing the display device from being designated as a defective device by the presence of only minute cracks that have substantially no influence on quality of the display device, and improving resistance against cracks by preventing propagation of the cracks generated in the display device.

The foregoing general description and the following detailed description are exemplary and explanatory and are intended to provide further explanation of the claimed subject matter.

BRIEF DESCRIPTION OF THE DRAWINGS

The accompanying drawings, which are included to provide a further understanding of the inventive concepts, and are incorporated in and constitute a part of this specification, illustrate exemplary embodiments of the inventive concepts, and, together with the description, serve to explain principles of the inventive concepts.

DETAILED DESCRIPTION OF THE ILLUSTRATED EMBODIMENTS

Figure 1:
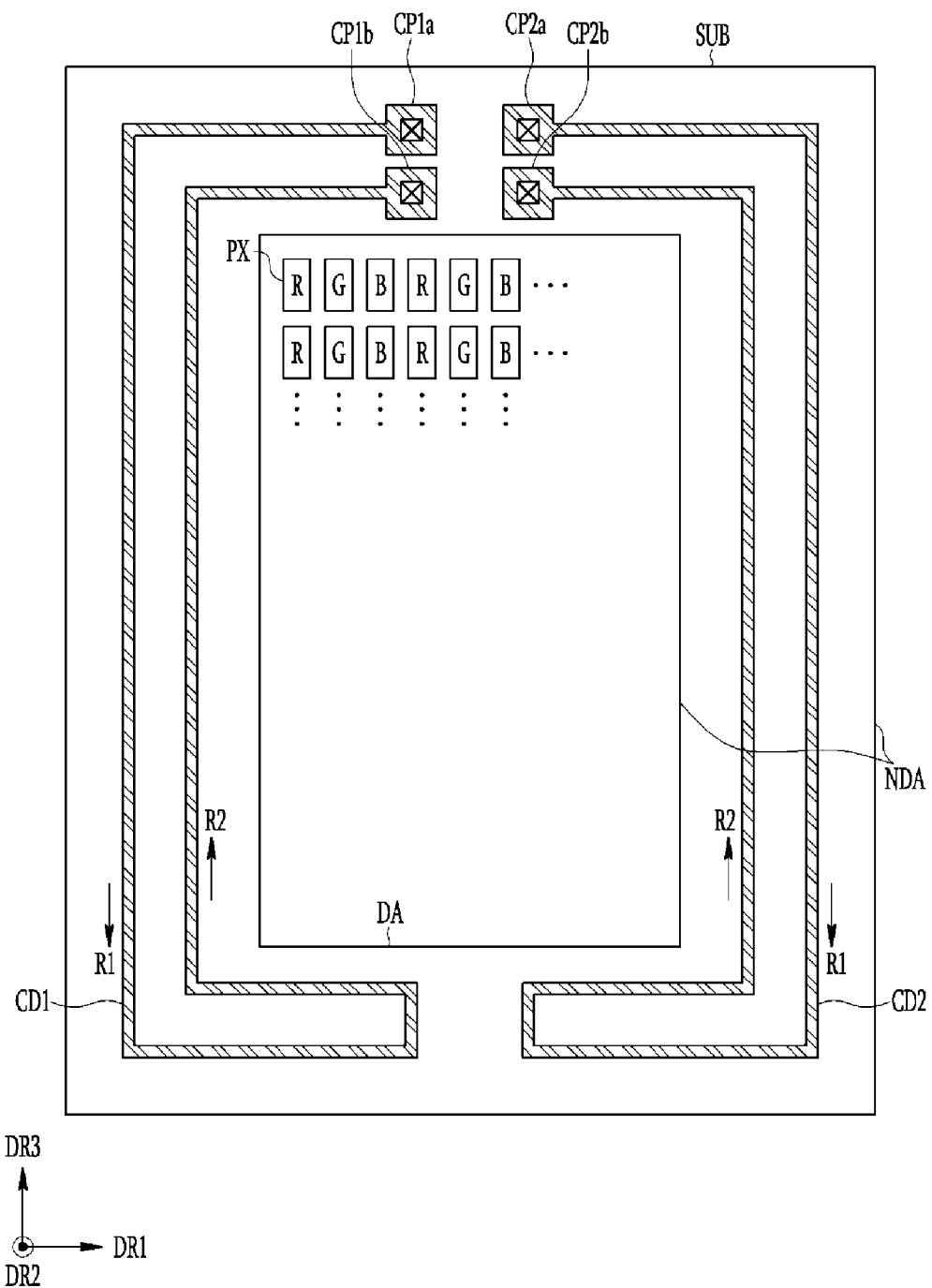
FIG. 1 is a top plan view of a first embodiment of a display device constructed according to of the principles of the invention.

In the following description, for the purposes of explanation, numerous specific details are set forth in order to provide a thorough understanding of various exemplary embodiments. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments.

In the accompanying figures, the size and relative sizes of layers, films, panels, regions, etc., may be exaggerated for clarity and descriptive purposes. Also, like reference numerals denote like elements.

When an element or layer is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. Like numbers refer to like elements throughout. As used herein, the term "and/or" includes any and all combinations of one or more of the associated listed items.

Although the terms first, second, etc. may be used herein to describe various elements, components, regions, layers, and/or sections, these elements, components, regions, layers, and/or sections should not be limited by these terms. These terms are used to distinguish one element, component, region, layer, and/or section from another element, component, region, layer, and/or section. Thus, a first element, component, region, layer, and/or section discussed below could be termed a second element, component, region, layer, and/or section without departing from the teachings of the present disclosure.

Spatially relative terms, such as "beneath," "below," "lower," "above," "upper," and the like, may be used herein for descriptive purposes, and, thereby, to describe one element or feature's relationship to another element(s) or feature(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof.

Various exemplary embodiments are described herein with reference to sectional illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not be construed as limited to the particular illustrated shapes of regions, but are to include deviations in shapes that result from, for instance, manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the drawings are schematic in nature and their shapes are not intended to illustrate the actual shape of a region of a device and are not intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and will not be interpreted in an idealized or overly formal sense, unless expressly so defined herein.

A display device according to one or more exemplary embodiments of the invention will now be described with reference to FIG. 1 to FIG. 4.

Figure 2:
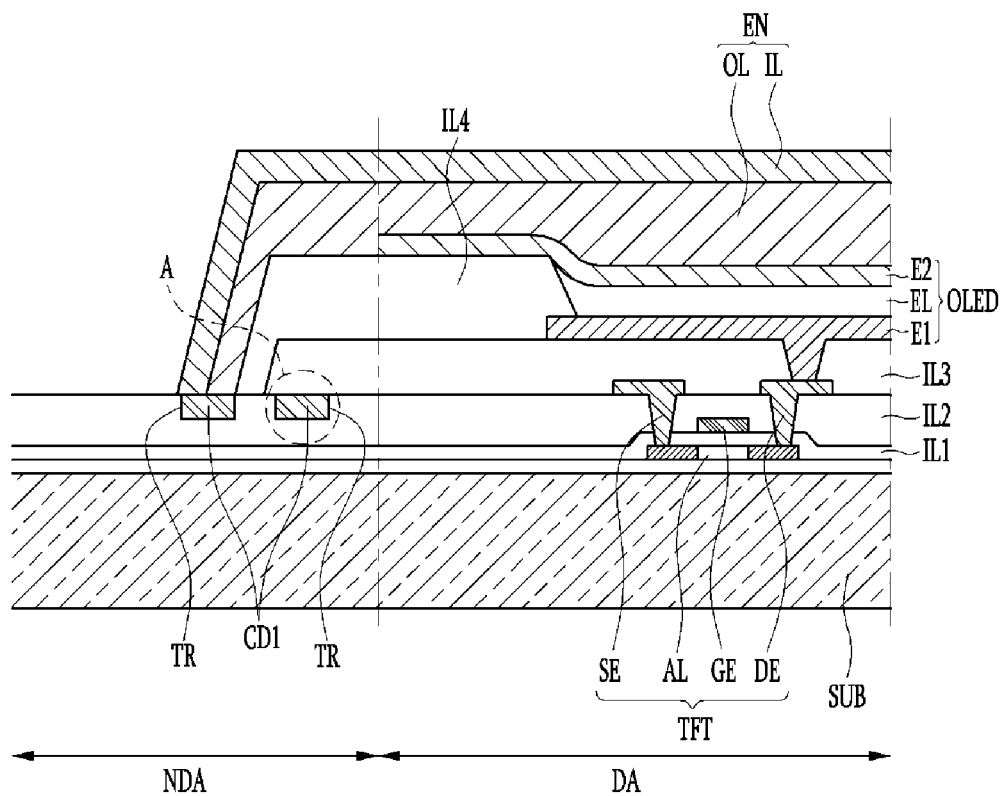
FIG. 2 is a cross-sectional view of the display device of FIG. 1 illustrating crack-sensing lines disposed in trenches in a second insulating layer.
Figure 3:
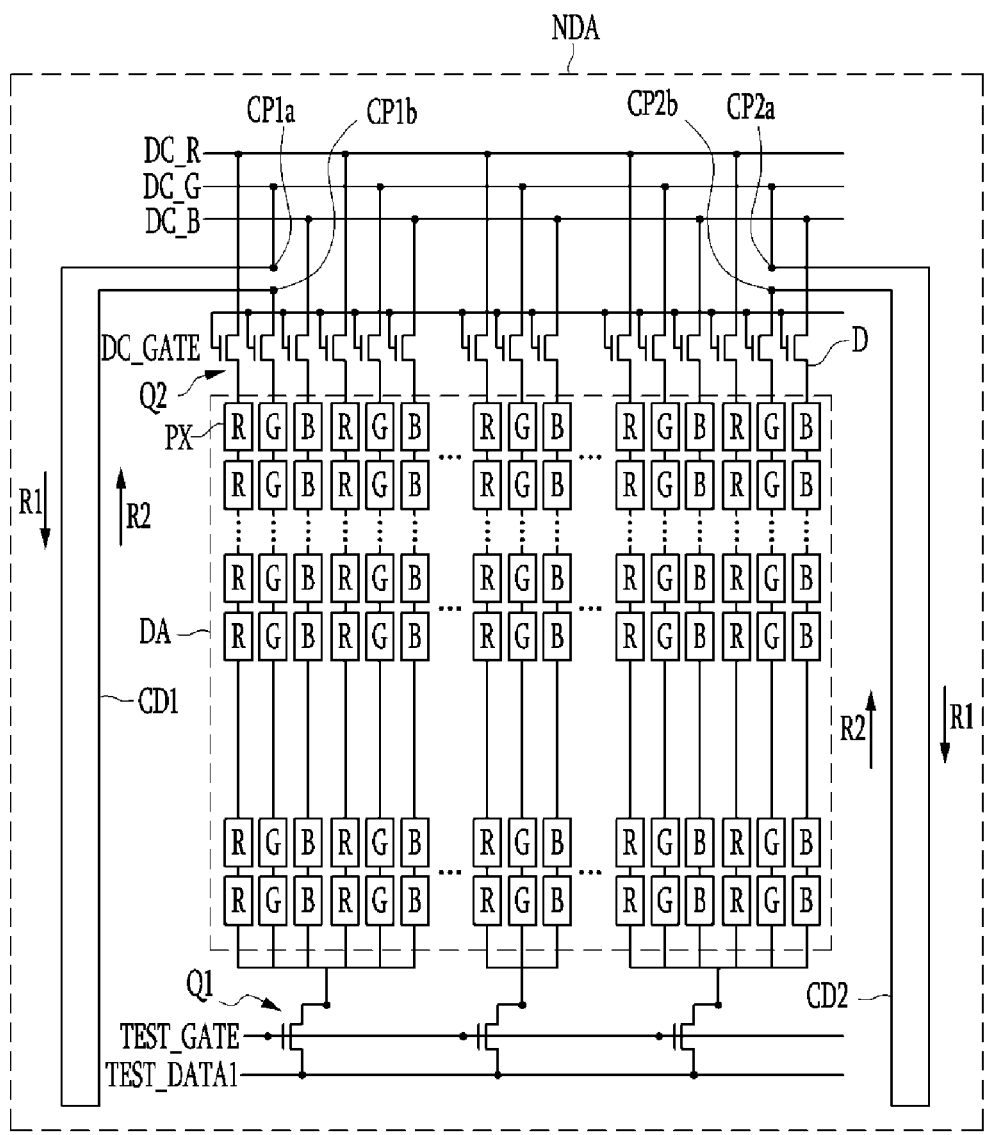
FIG. 3 illustrates a circuit diagram of the display device of FIG. 1 illustrating the electrical connections between crack-sensing lines, gates and pixels.
Figure 4:
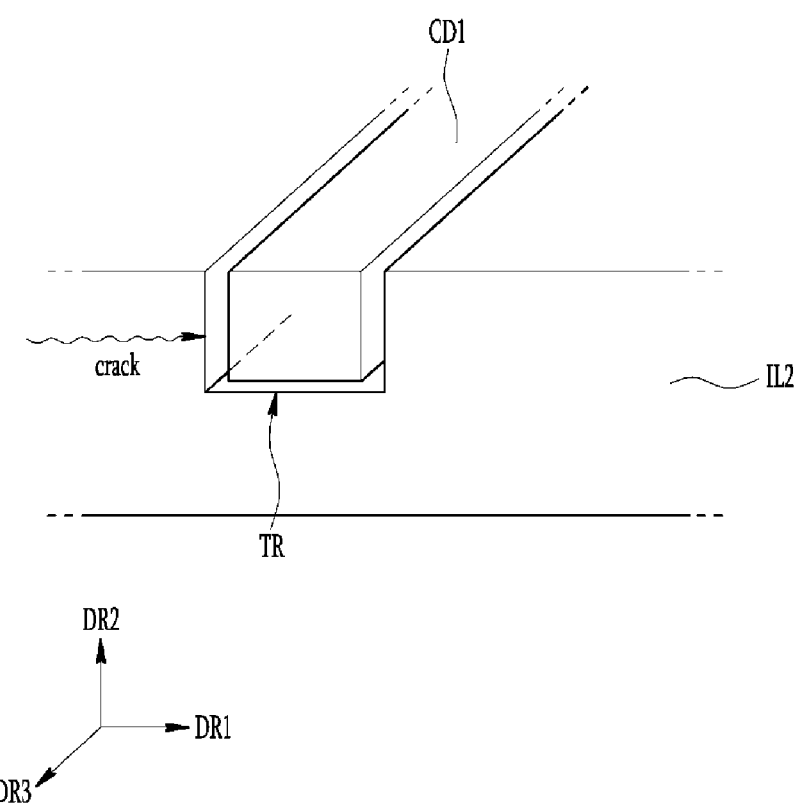
FIG. 4 is an enlarged view of area A of FIG. 2 illustrating one embodiment of a crack-sensing line of the invention.

FIG. 1 is a top plan view of a first embodiment of a display device constructed according to the principles of the invention. FIG. 2 is a cross-sectional view of the display device of FIG. 1 illustrating crack-sensing lines disposed in trenches in a second insulating layer. FIG. 3 illustrates a circuit diagram of the display device of FIG. 1 illustrating the electrical connections between crack-sensing lines, gates and pixels. FIG. 4 is an enlarged view of area A of FIG. 2 illustrating one embodiment of a crack-sensing line of the invention. Specifically, FIG. 2 illustrates a cross-section of a portion of one pixel PX in the display area DA of the display device at which the thin film transistor TFT is disposed and a cross-section obtained by cutting a portion of the non-display area NDA, through which the crack-sensing lines CD1 and CD2 extend, along a direction that is perpendicular to the longitudinal axes of the crack-sensing lines CD1 and CD2.

First, referring to FIG. 1, the display device includes a display area DA for displaying images, and a non-display area NDA disposed around the display area DA. In FIG. 1, it is illustrated that the non-display area NDA is positioned to surround four sides of the display area DA. However, exemplary embodiments are not limited thereto and, the non-display area NDA may be positioned outside one or more of sides of the display area DA. For example, the non-display area NDA may be positioned around some of the edges of the display area DA.

The display area DA includes a plurality of pixels PX. The pixels PX, each of which is a minimum unit for displaying an image, may include a first pixel R, a second pixel G, and a third pixel B that respectively display red, green, and blue. Pixels PX disposed at one column may display the same color, and columns of pixels which display different colors may be alternately disposed. However, the positioning of the pixels PX of the display device is not limited thereto. The pixels PX may display different colors in additional to the red, green, and blue.

The exemplary structure of each pixel PX will be described with reference to FIG. 2 and FIG. 3. One pixel PX includes at least one thin film transistor TFT disposed on a substrate SUB.

The substrate SUB may be an insulating substrate including glass, polymer, stainless steel, or other materials known in the art.

The substrate SUB may be flexible, stretchable, foldable, bendable, or rollable. For example, the substrate SUB may serve as a flexible film including a resin such as polyimide.

The thin film transistor TFT includes an active layer AL, a gate electrode GE, a source electrode SE, and a drain electrode DE. The gate electrode GE may be connected to a gate line (not illustrated), and the source electrode SE may be connected to a data line D. The gate line may be intersect the data line D and extend in a first direction DR1, and the data line D may extend in a third direction DR3 that intersects the first direction DR1.

The active layer AL may be formed of polysilicon or an oxide semiconductor. The active layer AL includes a channel area that is not doped with impurities, and a source area and a drain area that are disposed on opposite sides of the channel area and doped with impurities.

The gate electrode GE is disposed on the active layer AL, with a first insulating layer IL1 disposed therebetween. The source electrode SE and the drain electrode DE are disposed on a second insulating layer IL2, which covers the gate electrode GE, and are respectively connected to a source region and a drain region of the active layer AL through contact holes formed in the first insulating layer IL1 and the second insulating layer IL2. The drain electrode DE is connected to a first electrode E1 of the organic light emitting diode OLED through a contact hole formed in the third insulating layer IL3. In FIG. 2, the gate electrode GE is positioned above the active layer AL, however, the gate electrode may be positioned below the active layer. In one or more exemplary embodiments, at least one of the gate electrode GE, the source electrode SE, and the drain electrode DE may include a metal such as aluminum (Al), silver (Ag), copper (Cu), molybdenum (Mo), chromium (Cr), tantalum (Ta), and titanium (Ti), or a conductive material including at least one of alloys of these metals, and may be formed in a single-layer or a multilayer structure.

The first insulating layer ILL the second insulating layer IL2, and the third insulating layer IL3 may be disposed in the display area DA and the non-display area NDA. In one or more exemplary embodiments, at least one of the first insulating layer ILL the second insulating layer IL2, and the third insulating layer IL3 may include an organic insulating material or an inorganic insulating material such as a silicon oxide ($SiO_x$), a silicon nitride ($SiN_x$), a silicon oxynitride (SiON), a silicon oxyfluoride (SiOF), and an aluminum oxide ($AlO_x$), and may be formed in a single-layer or a multilayer structure.

The organic light emitting diode OLED includes a first electrode E1 connected to the drain electrode DE of the thin film transistor TFT, an organic emission layer EL disposed on the first electrode E1, and a second electrode E2 disposed on the organic emission layer EL. A pixel definition layer IL4 which defines a region at which the organic emission layer EL is to be formed may be disposed on the first electrode E1, and the organic emission layer EL may be disposed in an opening of the pixel definition layer IL4.

The first electrode E1 may be an anode which serves as a hole injection electrode, and the second electrode E2 may be a cathode which serves as an electron injection electrode. Alternatively, the first electrode E1 may be a cathode which serves as an electron injection electrode, and the second electrode E2 may be an anode which serves as a hole injection electrode.

The organic emission layer EL may be disposed between the first electrode E1 and the second electrode E2, and may be made of a low molecular weight organic material or a high molecular weight organic material, such as PEDOT (poly(3,4-ethylenedioxythiophene)) or the like. The organic emission layer EL may include one of a red organic emission layer for emitting red light, a green organic emission layer for emitting green light, and a blue organic emission layer for emitting blue light. The red organic emission layer, the green organic emission layer, and the blue organic emission layer are respectively formed on red, green, and blue pixels to implement a color image.

An encapsulation part EN may be disposed on the substrate SUB throughout the display area DA and the non-display area NDA of the substrate SUB. The encapsulation part EN encapsulates the display device by covering the substrate SUB with the organic light emitting diode OLED disposed therebetween. The encapsulation part EN serves to protect the organic light emitting diode OLED. The encapsulation part EN may include an organic layer OL and an inorganic layer IL disposed on the organic layer OL. The encapsulation part EN may be formed as a thin film encapsulation part. In one or more exemplary embodiments, the encapsulation part EN may include at least one organic layer and at least one inorganic layer which are alternately stacked. Specifically, a plurality of inorganic layers and a plurality of organic layers may be provided, and may be mutually alternately stacked. For example, the encapsulation part EN may have at least one sandwich structure in which at least one organic layer is inserted between at least two inorganic layers.

The non-display area NDA will be described with reference to FIG. 3 and FIG. 4 as well as FIG. 1. A plurality of signal lines are connected to the pixels PX. At least some of the signal lines are disposed in the non-display area NDA of the substrate.

The signal lines disposed in the non-display area NDA may include a first test gate line TEST_GATE, a second test gate line DC_GATE, a first test signal line TEST_DATA1, a plurality of second test signal lines DC_R, DC_G, and DC_B, a first crack-sensing line CD1, and a second crack-sensing line CD2.

Control terminals of first switching elements Q1 disposed in the non-display area NDA may be connected to the first test gate line TEST_GATE, and input terminals thereof may be connected to the first test signal line TEST_DATA1. Output terminals of the first switching elements Q1 may be connected to a plurality of data lines D each connected to the thin film transistor TFT of each of the pixels PX.

Control terminals of second switching elements Q2 may be connected to the second test gate line DC_GATE, and input terminals thereof may be connected to the second test signal lines DC_R, DC_G, and DC_B. Output terminals of the second switching elements Q2 may be connected to the data lines D. A first pixel R of the pixels PX may be connected to the second test signal line DC_R through one of the second switching elements Q2. A second pixel G thereof may be connected to the second test signal line DC_G through one of the second switching elements Q2, and a third pixel B thereof may be connected to the second test signal line DC_B through one of the second switching elements Q2.

The first crack-sensing line CD1 and the second crack-sensing line CD2 may be disposed in non-display areas NDA and positioned at opposite sides of the display area DA.

The first crack-sensing line CD1 is connected to at least one of the data lines D through the first connector CP1a and the second connector CP1b. The data line D connected to the first crack-sensing line CD1 may be connected to the second test signal line DC_G. A first end of the first crack-sensing line CD1 may be connected to the input terminal of the second switching element Q2 through the second connector CP1b.

The first crack-sensing line CD1 may be connected to the second connector CP1b by extending from the first connector CP1a in a first direction DR1 at a left side of the non-display area NDA, changing the direction via an end loop, and extending in a second direction R2 that is opposite to the first direction DR1. As a result, the first crack-sensing line CD1 may be disposed around the left side of the non-display area NDA.

Similarly, the second crack-sensing line CD2 is connected to at least one of the data lines D through a third connector CP2a and a fourth connector CP2b. The data line D connected to the second crack-sensing line CD2 may be connected to the second test signal line DC_G. A first end of the second crack-sensing line CD2 may be connected to the input terminal of the second switching element Q2 through the fourth connector CP2b.

The second crack-sensing line CD2 may be connected to the fourth connector CP2b by extending from the third connector CP2a in the first direction DR1 at a right side of the non-display area NDA, changing the direction via an end loop, and extending in the second direction R2 that is opposite to the first direction DR1. As a result, the second crack-sensing line CD2 may be disposed around the right side of the non-display area NDA.

The first crack-sensing line CD1 and the second crack-sensing line CD2 thus may be formed to have a substantially looped shape by extending in the first direction DR1 and returning in the second direction R2 that is opposite to the first direction DR1 with the display area DA interposed therebetween. In addition, the shapes of the first crack-sensing line CD1 and the second crack-sensing line CD2 may be the same, as shown or different.

Referring to FIG. 2 and FIG. 4, the first crack-sensing line CD1 may be buried in a first trench TR disposed in the second insulating layer IL2. The first trench TR has a cross section defined by a width and a depth corresponding to the cross sectional shape of the first crack-sensing line CD1. The first trench TR may be formed to have an elongated ditch-like shape with a narrow width defined by two side walls, one bottom surface, and an open top. A cross-section obtained by cutting the first trench TR along a plane formed by the first direction DR1 and the second direction DR2 may have a quadrangular shape. The first trench TR may be formed to have a substantially looped shape by extending in the first direction DR1 at the left side of the non-display area NDA and returning in the second direction R2 that is opposite to the first direction DR1. The first crack-sensing line CD1 is buried in the first trench TR, and thus the shapes of the first crack-sensing line CD1 and the first trench TR may substantially correspond to each other. The first crack-sensing line CD1 may be formed to fit in the first trench TR. However, the width and area of the first crack-sensing line CD1 may be smaller than those of the first trench TR. The first crack-sensing line CD1 may include the same material as that of the source electrode SE or the drain electrode DE, and may be disposed at or in the same layer as that of the source electrode SE or the drain electrode DE.

The first trench TR may be formed when contact holes for connecting the source electrode SE and the drain electrode DE to the active layer AL are formed after the second insulating layer IL2 is stacked. In addition, the first crack-sensing line CD1 may be formed by using the same material as that of the source electrode SE and the drain electrode DE when they are formed.

The second crack-sensing line CD2 may be buried in a second trench (not illustrated in FIG. 4) disposed in the second insulating layer IL2. The second trench may be disposed in the second insulating layer IL2 to have an area and a depth corresponding to those of the second crack-sensing line CD2. The second trench may be formed to have a substantially looped shape by extending in the first direction DR1 at the right side of the non-display area NDA and returning in the second direction R2 that is opposite to the first direction DR1. The second crack-sensing line CD2 is buried in the second trench, and thus the shapes of the second crack-sensing line CD2 and the second trench may substantially correspond to each other. The second crack-sensing line CD2 may include the same material as that of the source electrode SE or the drain electrode DE, and may be disposed at or in the same layer as that of the source electrode SE or the drain electrode DE.

The second trench may be formed when the first trench TR and the contact holes for connecting the source electrode SE and the drain electrode DE to the active layer AL are formed after the second insulating layer IL2 is stacked. In addition, the second crack-sensing line CD2 may be formed by using the same material as that of the source electrode SE, the drain electrode DE, and the first crack-sensing line CD1 when they are formed.

Hereinabove, the display device according to an exemplary embodiment of the invention has been described, but exemplary embodiments are not limited thereto and may have numerous modifications in accordance with the broad principles of the invention. For example, first ends of the first crack-sensing line CD1 and the second crack-sensing line CD2 may be connected to the output terminal of the second switching element Q2. Moreover, the data line D connected to the first crack-sensing line CD1 and the second crack-sensing line CD2 may be connected to the second test signal line DC_R or the second test signal line DC_B instead of the second test signal line DC_G. Also, the first crack-sensing line CD1 and the second crack-sensing line CD2 may be respectively connected to data lines connected to different signal lines. For example, each of the first crack-sensing line CD1 and the second crack-sensing line CD2 may be connected to one of the first test gate line TEST_GATE and the second test gate line DC_GATE.

In addition, the design of the crack-sensing lines CD1 and CD2 is not limited to the exemplary illustrations. For example, the crack-sensing lines CD1 and CD2 may be disposed to loop back and forth in the non-display area NDA many times, may be disposed in a zigzag shape, or may be disposed such that one crack-sensing line extends in the non-display area NDA to surround the display area DA. As the crack-sensing lines CD1 and CD2 are more densely disposed in the non-display area NDA, it is possible to sense cracks in a wide area without missing areas that may contain cracks. Any positioning of the crack-sensing lines CD1 and CD2 capable of sensing the cracks may be used without being limited to a specific shape. In addition, one or more crack-sensing lines may be used.

In the aforementioned exemplary embodiments, an example in which the invention is applied to a organic light emitting diode display has been described. However, the exemplary embodiments may be applied to various types of display devices including a liquid crystal display. When the exemplary embodiments are applied to the liquid crystal display, a liquid crystal layer may be included instead of the organic emission layer EL, and a backlight unit may be further included.

Hereinafter, an exemplary operation and an effect of a display device according to the principle of the invention will be described with reference to FIG. 2 to FIG. 5.

Figure 5:
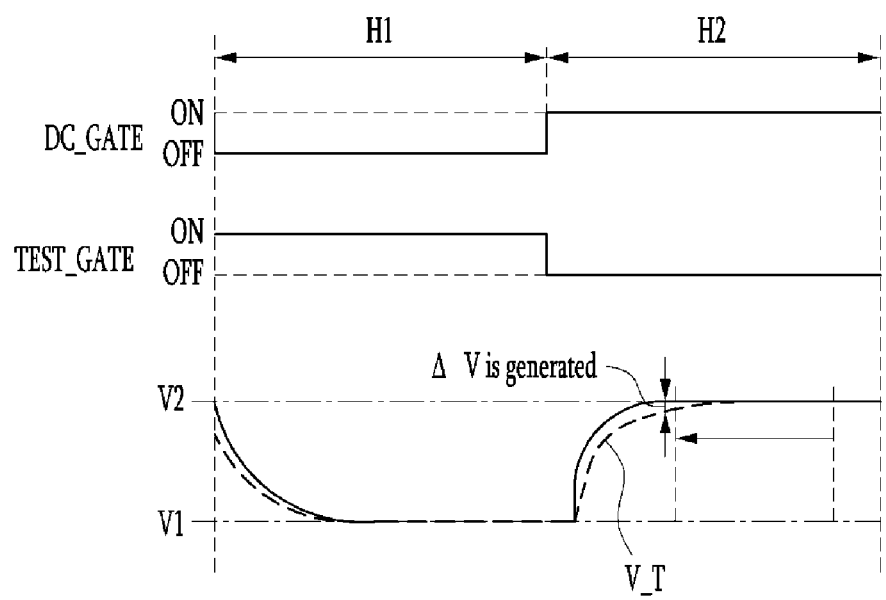
FIG. 5 is a waveform diagram illustrating exemplary signals generated by the circuit diagram of the display device of FIG. 3.

FIG. 5 is a waveform diagram illustrating exemplary signals generated by the circuit diagram of the display device of FIG. 3.

Referring to FIGS. 3 and 5, when a gate-on signal is applied to the first test gate line TEST_GATE for a first time period H1, the first switching elements Q1 connected to the data lines D are turned on to apply a first signal V1, from the first test signal line TEST_DATA1, to the data lines D. The first signal V1 may serve as a signal to drive the pixels PX to display white, and the pixels PX may display white when the first signal V1 is applied to the data lines D.

When the gate-on signal is applied to the second test gate line DC_GATE for a second time period H2 after a gate-off signal is applied to the first test gate line TEST_GATE, the second switching elements Q2 connected to the data lines D are turned on to apply a second signal V2, from the second test signal lines DC_R, DC_G, and DC_B, to the data lines D. The second signal V2 may serve as a signal to drive the pixels PX to display black, and the pixels PX may display black by applying the second signal V2 to the data lines D.

In this case, assume cracks are generated in the non-display area NDA positioned at an edge of the display area DA due to an external impact applied to the display device, and the first crack-sensing line CD1 and the second crack-sensing line CD2 may be damaged. Accordingly, resistance of the data lines D connected to the first crack-sensing line CD1 and the second crack-sensing line CD2 is increased, and thus a voltage V_T applied to the pixels connected to the first crack-sensing line CD1 and the second crack-sensing line CD2 may not be charged to the second signal V2 within a given time duration, thereby generating a voltage difference $\Delta V$ with the second signal V2. As the voltage difference $\Delta V$ is generated, the pixels connected to the first crack-sensing line CD1 and the second crack-sensing line CD2 may not display black, and may display relative brightness. Thus, the cracks which may have been generated in the non-display area NDA adjacent to the edge of the display area DA can be sensed through such a bright line.

According to the principles of the invention, the first crack-sensing line CD1 and the second crack-sensing line CD2 are buried in trenches of an insulating layer, and thus are more resistant to cracking as compared with crack-sensing lines disposed on the insulating layer to be exposed. Accordingly, the crack-sensing lines CD1 and CD2 may not be damaged by minute cracks that do not substantially affect quality of the display device, and such cracks may not be sensed through the test lines and pixels connected to the crack-sensing lines CD1 and CD2. Thus, a display device with minute cracks may not be determined to be defective, as the case in which significant cracks are generated in the device. As a result, the display device may be prevented from being designated as a defective device even though minute cracks causing substantially no effect on the quality of the display device are generated in the non-display area NDA.

In addition, since the crack-sensing lines CD1 and CD2 that are not damaged by the minute cracks are disposed in a reciprocating or looped form along the non-display area NDA, even when minute cracks are generated, the generated cracks are prevented from being transferred by the crack-sensing lines CD1 and CD2. Accordingly, it is possible to substantially prevent the cracks from being propagated in the display area DA.

In contrast, when cracks are generated such that the crack-sensing lines CD1 and CD2 are damaged, the cracks can be sensed through the pixels connected to the crack-sensing lines CD1 and CD2.

As such, the crack-sensing lines CD1 and CD2 are not affected by minute cracks but are affected by cracks causing an influence on product quality. Accordingly, it is possible to sense crack causing errors while preventing unnecessary crack sensing of minute or insignificant cracking.

Hereinafter, other embodiments of crack-sensing lines constructed according to the principles of the invention will be described with reference to FIGS. 6 and 7. A description related to the same components and configurations as those of the aforementioned exemplary embodiment is unnecessary and will be omitted to avoid redundancy.

Figure 6:
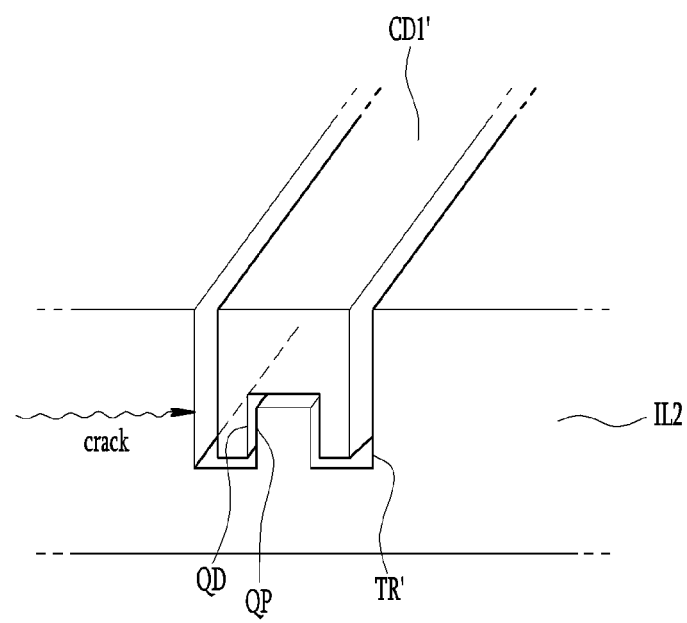
FIG. 6 is an enlarged view of area A of FIG. 2 illustrating a second embodiment of a crack-sensing line of the invention.
Figure 6:
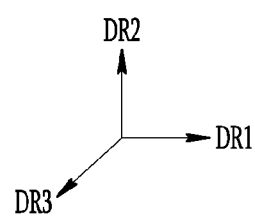

FIG. 6 is an enlarged view of area A of FIG. 2 illustrating a second embodiment of a crack-sensing line of the invention.

The first crack-sensing line CD1 may be buried in the first trench TR' disposed in the second insulating layer IL2. The first trench TR' may further include a quadrangular protrusion QP. The first trench TR' may be formed to have two side walls and one bottom surface, and the quadrangular protrusion QP that projects in the second direction DR2 may extend upwardly from the bottom surface. A cross-section obtained by cutting the quadrangular protrusion QP along a plane formed by the first direction DR1 and the second direction DR2 may have a quadrangular shape.

The shape of the first crack-sensing line CD1' may correspond to the shape of the first trench TR'. In the first crack-sensing line CD1', a quadrangular recess portion QD that is recessed in the second direction DR2 may be positioned at the region corresponding to the quadrangular protrusion QP. The shapes of the first crack-sensing line CD1' and the first trench TR' may correspond to each other.

Although not illustrated, the second crack-sensing line may be buried in the second trench including the quadrangular protrusion of the second insulating layer IL2, similar to the first crack-sensing line CD1'. Alternatively, the shape of the second crack-sensing line may be different from that of the first crack-sensing line CD1'.

Figure 7:
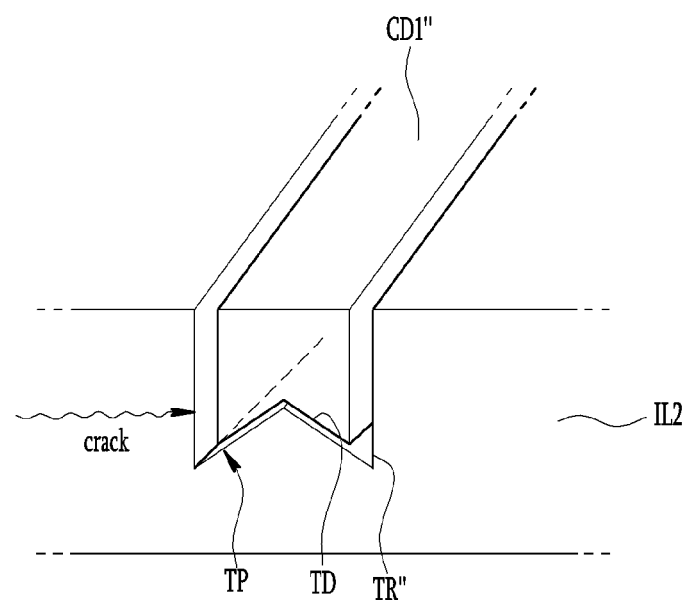
FIG. 7 is an enlarged view of area A of FIG. 2 illustrating a third embodiment of a crack-sensing line of the invention.
Figure 7:
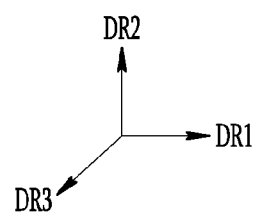

FIG. 7 is an enlarged view of area A of FIG. 2 illustrating a third embodiment of a crack-sensing line of the invention.

The first crack-sensing line CD1" may be buried in the first trench TR" disposed in the second insulating layer IL2. The first trench TR may further include a triangular protrusion TP. The first trench TR" may be formed to have two side walls and one bottom surface, and the triangular protrusion TP that projects in the second direction DR2 may extend upwardly from the bottom surface. A cross-section obtained by cutting the triangular protrusion TP along a plane formed by the first direction DR1 and the second direction DR2 may have a triangular shape.

The shape of the first crack-sensing line CD1" may correspond to the shape of the first trench TR". In the first crack-sensing line CD1", a triangular recess portion TD that is recessed in the second direction DR2 may be positioned at the region corresponding to the triangular protrusion TP. The shapes of the first crack-sensing line CD1" and the first trench TR" may correspond to each other.

Although not illustrated, the second crack-sensing line may be buried in the second trench including the triangular protrusion of the second insulating layer IL2, similar to the first crack-sensing line CD1". Alternatively, the second crack-sensing line may be buried in the second trench including a quadrangular protrusion of the second insulating layer IL2, and the shape of the second crack-sensing line may be different from that of the first crack-sensing line CD1". In addition, the protrusion is not limited to a triangular shape. For example, a polygonal protrusion or a curved protrusion may be provided. In this case, the crack-sensing line may also have a mating polygonal or curved recess portion corresponding to the polygonal or curved protrusion.

Hereinafter, additional, exemplary embodiments of display devices constructed according to the principles of the invention will be described with reference to FIGS. 8 and 9. A description related to the same components and configurations as those of the aforementioned exemplary embodiments are unnecessary and will be omitted to avoid redundancy.

Figure 8:
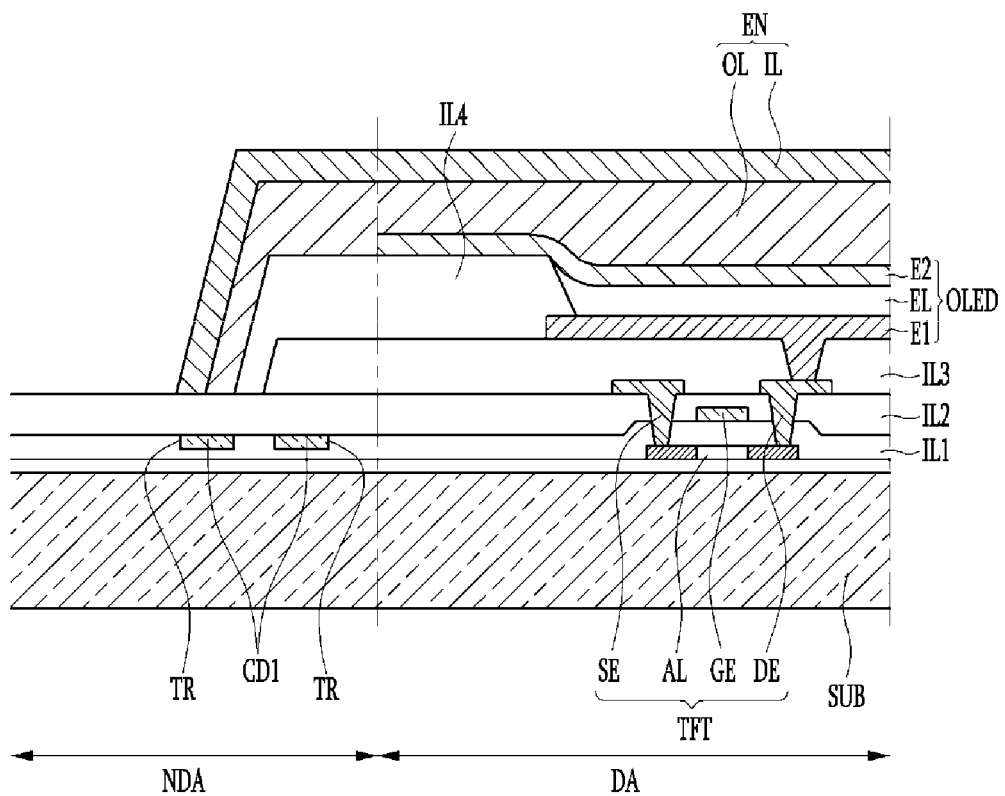
FIG. 8 is a cross-sectional view of a second embodiment of a display device of the invention illustrating crack-sensing lines disposed in trenches of a first insulating layer.
Figure 8:
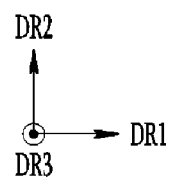

FIG. 8 is a cross-sectional view of a second embodiment of a display device of the invention illustrating crack-sensing lines disposed in trenches of a first insulating layer.

The first crack-sensing line CD1 may be buried in the first trench TR disposed in the first insulating layer IL1. The first trench TR having a width and a depth that correspond to those of the first crack-sensing line CD1 may be disposed in the first insulating layer IL1. The first trench TR may be formed to have an elongated, ditch-like shape with a narrow width and have two side walls and one bottom surface. A cross-section obtained by cutting the first trench TR along a plane formed by the first direction DR1 and the second direction DR2 may have a quadrangular shape.

The first crack-sensing line CD1 is buried in the first trench TR. The shapes of the first crack-sensing line CD1 and the first trench TR may substantially correspond to each other. The first crack-sensing line CD1 may include a same material as that of the gate electrode GE.

The first trench TR may be formed by patterning the stacked first insulating layer IL1. Thereafter, the first crack-sensing line CD1 may be formed together with the gate electrode GE by using the same material as that of the gate electrode GE.

Similarly, the crack-sensing line CD2 may be buried in a second trench (not illustrated in FIG. 8) disposed in the first insulating layer ILL and may further include the same material as that of the gate electrode GE.

However, exemplary embodiments are not limited to the illustrated structures. For example, the first trench TR or the second trench disposed in the first insulating layer IL1 may include a quadrangular or triangular protrusion at the bottom surface thereof, and the first crack-sensing line CD1 or the second crack-sensing line may include a quadrangular or triangular recess portion at the region corresponding to the quadrangular or triangular protrusion. Alternatively, the shapes of the first crack-sensing line CD1 and the second crack-sensing line may be different from each other. The first crack-sensing line CD1 may be buried in the first insulating layer ILL and the second crack-sensing line may be buried in the second insulating layer IL2.

Figure 9:
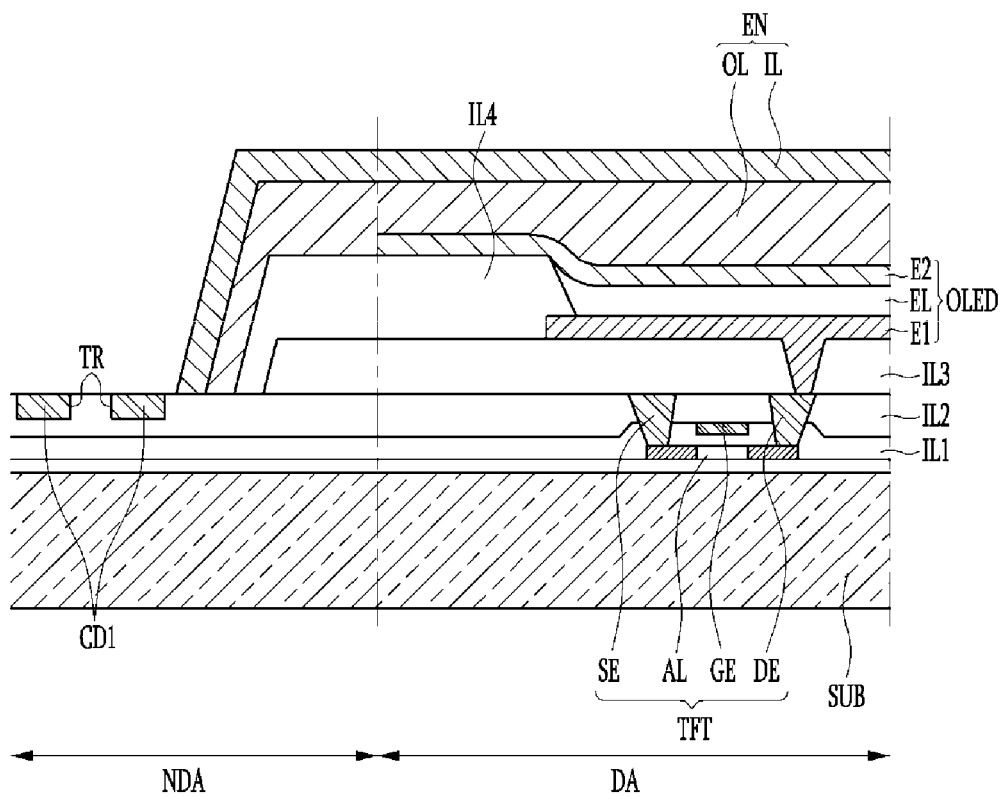
FIG. 9 is a cross-sectional view of a third embodiment of a display device of the invention illustrated crack sensing lines dispose outside an encapsulation part.

FIG. 9 is a cross-sectional view of a third embodiment of a display device of the invention illustrated crack sensing lines dispose outside an encapsulation part.

The first crack-sensing line CD1 of the non-display area NDA may be buried in the second insulating layer IL2 without being overlapped with the encapsulation part EN. In other words, the crack sensing lines may be disposed in the second insulating later outside the encapsulation part. The gate electrode GE disposed in the display area DA may be buried in the first insulating layer ILL and the source electrode SE or the drain electrode DE may be buried in the second insulating layer IL2.

The gate electrode GE buried in the first insulating layer IL1 may be formed by stacking the first insulating layer ILL patterning an electrode trench for burying the gate electrode GE, and forming the gate electrode material in the electrode trench. Next, the second insulating layer IL2 is stacked, the first trench TR and electrode trenches for connecting the source electrode SE and the drain electrode DE to the active layer AL may be patterned, and the first crack-sensing line CD1, the source electrode SE, and the drain electrode DE may be formed to be buried in the second insulating layer IL2.

However, exemplary embodiments are not limited to these structures. For example, at least one of the gate electrode GE, the source electrode SE, and the drain electrode DE may be buried in the insulating layer. For example, the first crack-sensing line CD1 and the gate electrode GE may be buried in the first insulating layer ILL and the source electrode SE and the drain electrode DE may be buried in the second insulating layer IL2. In this case, the first trench TR may be disposed in the first insulating layer IL1 and include a quadrangular or triangular protrusion at the bottom surface thereof, and the first crack-sensing line CD1 may include a quadrangular or triangular recess portion at the region corresponding to the quadrangular or triangular protrusion.

Hereinafter, a further exemplary embodiment of the invention will be described with reference to FIG. 10 and FIG. 11. A description related to the same components and configurations as those of the aforementioned exemplary embodiments are unnecessary and will be omitted to avoid redundancy.

Figure 10:
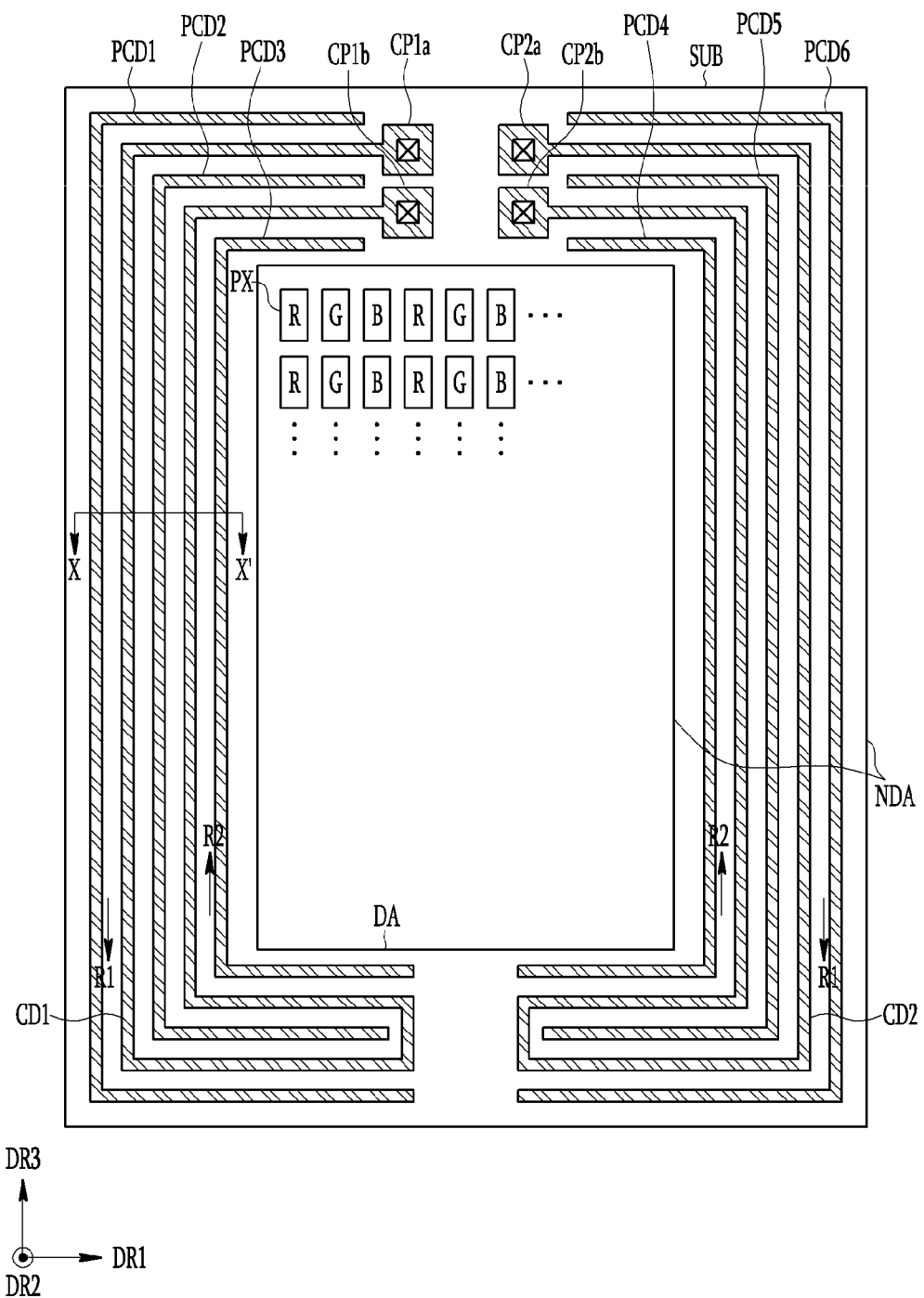
FIG. 10 is a top plan view schematically illustrating a third embodiment of a display device the invention illustrating dummy lines to prevent cracks from propagating in the device.
Figure 11:
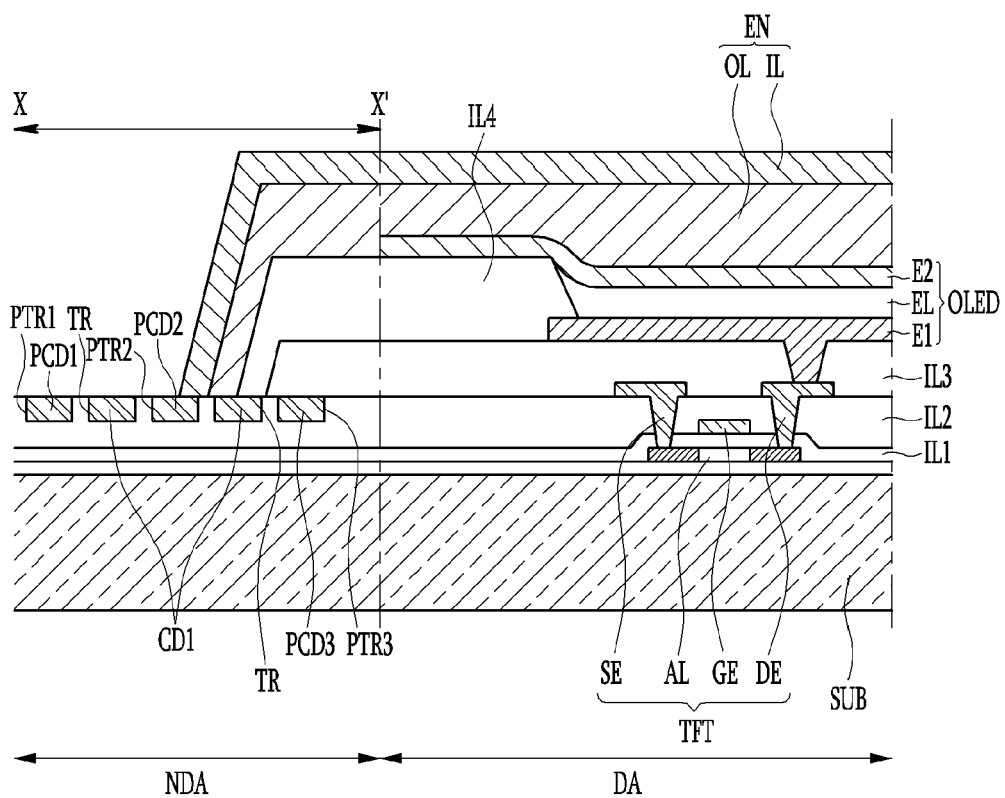
FIG. 11 is a cross-sectional view taken along lines X-X' of FIG. 10.
Figure 11:
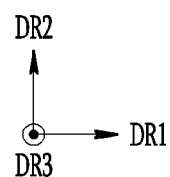

FIG. 10 is a top plan view schematically illustrating a third embodiment of a display device of the invention illustrating dummy lines to prevent cracks from propagating in the device. FIG. 11 is a cross-sectional view taken along lines X-X' of FIG. 10. Particularly, X-X' portion in FIG. 11 shows a cross-section taken along the line X-X' of FIG. 10.

Protection lines may be disposed at opposite sides of first crack-sensing lines CD1 or between the first crack-sensing lines CD1 to help prevent propagation of cracks. The protection lines may not be electrically connected to other components of the display device and/or may not be connected to each other. A first protection line PCD1 may be disposed at a left side of the first crack-sensing lines CD1, a second protection line PCD2 may be disposed between the first crack-sensing lines CD1, and a third protection line PCD3 may be disposed at a right side of the first crack-sensing lines CD1. The first crack-sensing lines CD1 partially overlap the encapsulation part EN.

The first protection line PCD1, the second protection line PCD2, and the third protection line PCD3 may be disposed along the first crack-sensing lines CD1 to surround a left edge of the display area DA. Each of the first protection line PCD1, the second protection line PCD2, and the third protection line PCD3 may be parallel to the first crack-sensing lines CD1. The first protection line PCD1, the second protection line PCD2, or the third protection line PCD3 may include the same material as that of the first crack-sensing lines CD1, the source electrode SE, or the drain electrode DE.

The first protection line PCD1, the second protection line PCD2, and the third protection line PCD3 may be respectively buried in first protection line trenches PTR1, PTR2, and PTR3 disposed in the second insulating layer IL2. Specifically, the first protection line PCD1 may be buried in the first protection line trench PTR1, the second protection line PCD2 may be buried in the first protection line trench PTR2, and the third protection line PCD3 may be buried in the first protection line trench PTR3. The first protection line trench PTR1 having an area and a depth corresponding to the first protection line PCD1, the first protection line trench PTR2 having an area and a depth corresponding to the second protection line PCD2, and the first protection line trench PTR3 having an area and a depth corresponding to the third protection line PCD3 may be disposed in the second insulating layer IL2.

Each of the first protection line trenches PTR1, PTR2, and PTR3 may be formed to have an elongated, ditch-like shape with a narrow width and have two side walls and one bottom surface. Cross-sections obtained by cutting the first protection line trenches PTR1, PTR2, and PTR3 along a plane formed by the first direction DR1 and the second direction DR2 may respectively have quadrangular shapes. The first protection line trenches PTR1, PTR2, and PTR3 may be disposed along the first trench TR to surround a left half of the non-display area NDA. The first protection line trenches PTR1, PTR2, and PTR3 may be parallel to the first trench TR. Shapes of the first protection line PCD1 and the first protection line trench PTR1 may correspond to each other, shapes of the second protection line PCD2 and the first protection line trench PTR2 may correspond to each other, and shapes of the third protection line PCD3 and the first protection line trench PTR3 may correspond to each other.

The first protection line trenches PTR1, PTR2, and PTR3 may be formed together when the first trench TR and contact holes for connecting the source electrode SE and the drain electrode DE to the active layer AL after the second insulating layer IL2 is stacked. In addition, the first protection line PCD1, the second protection line PCD2, or the third protection line PCD3 may be formed by using a same material as those of the source electrode SE, the drain electrode DE, and the first crack-sensing lines CD1 when they are formed.

Protection lines may be disposed at opposite sides of second crack-sensing lines CD2, or between the second crack-sensing lines CD2. A fourth protection line PCD4 may be disposed at a left side of the second crack-sensing lines CD2, a fifth protection line PCD5 may be disposed between the second crack-sensing lines CD2, and a sixth protection line PCD6 may be disposed at a right side of the second crack-sensing lines CD2. The fourth protection line PCD4, the fifth protection line PCD5, and the sixth protection line PCD6 may be disposed along the second crack-sensing lines CD2 to surround a right edge of the display area DA. Each of the fourth protection line PCD4, the fifth protection line PCD5, and the sixth protection line PCD6 may be parallel to the second crack-sensing lines CD2. The fourth protection line PCD4, the fifth protection line PCD5, or the sixth protection line PCD6 may include a same material as that of the second crack-sensing lines CD2, the source electrode SE, or the drain electrode DE.

Second protection line trenches (not illustrated in FIG. 11) corresponding to the fourth protection line PCD4, the fifth protection line PCD5, and the sixth protection line PCD6 may be disposed in the second insulating layer IL2. The fourth protection line PCD4, the fifth protection line PCD5, and the sixth protection line PCD6 may be buried in the second protection line trenches disposed in the second insulating layer IL2.

Each of the second protection line trenches may be formed to have an elongated, ditch-like shape with a narrow width and have two side walls and one bottom surface. A cross-section obtained by cutting each of the second protection line trenches along a plane formed by the first direction DR1 and the second direction DR2 may have a quadrangular shape. The second protection line trenches may be disposed along the second trench (not illustrated) to surround the right edge of the display area DA. The second protection line trenches may be parallel to the second trench.

The second protection line trenches may be formed together when the first trench TR and contact holes for connecting the source electrode SE and the drain electrode DE to the active layer AL after the second insulating layer IL2 is stacked. In addition, the fourth protection line PCD4, the fifth protection line PCD5, and the sixth protection line PCD6 may be formed by using a same material as those of the source electrode SE, the drain electrode DE, and the second crack-sensing lines CD2 when they are formed. The first protection line trenches PTR1, PTR2, and PTR3 and the second protection line trenches may be symmetrical to each other, but they are not necessarily symmetrical to each other.

In FIG. 10, one first protection line PCD1 is illustrated, but the first protection line PCD1 may have disconnected portions, that is, may have a plurality of protection lines. Similarly, each of the second protection line PCD2, the third protection line PCD3, the fourth protection line PCD4, fifth protection line PCD5, and the sixth protection line PCD6 may have disconnected portions, that is, may have a plurality of protection lines. One or more of the first protection line PCD1, the second protection line PCD2, the third protection line PCD3, the fourth protection line PCD4, the fifth protection line PCD5, and the sixth protection line PCD6 may be omitted, and each of the first protection line PCD1, the second protection line PCD2, the third protection line PCD3, the fourth protection line PCD4, the fifth protection line PCD5, and the sixth protection line PCD6 may include one or more protection lines. As a result, the display device may include one or more protection lines, and the number of the protection lines may be greater than six. Further, each of the first protection line trenches PTR1, PTR2, and PTR3 or the second protection line trenches may include a quadrangular or triangular protrusion at the bottom surface thereof, and each of the protection lines may include a quadrangular or triangular recess portion at the region corresponding to the quadrangular or triangular protrusion. Further, one or more protection lines may be buried in the first insulating layer IL1. In this case, the protection lines may be formed together by using the same material as that of the gate electrode GE. The design of the protection lines may be changed depending on the design of the crack-sensing lines such that the protection lines are substantially parallel to the crack-sensing lines.

The protection lines are buried in trenches of the insulating layer, and thus are more resistant to cracking. Accordingly, the protection lines may serve to prevent the cracks generated in the display device from propagating to the display area DA. As a result, it is possible to provide a display device that is more resistant against cracking.

Hereinafter, a further exemplary embodiment of the invention will be described with reference to FIG. 12 and FIG. 13. A description related to the same components and configurations as those of the aforementioned exemplary embodiments are unnecessary and will be omitted to avoid redundancy.

Figure 12:
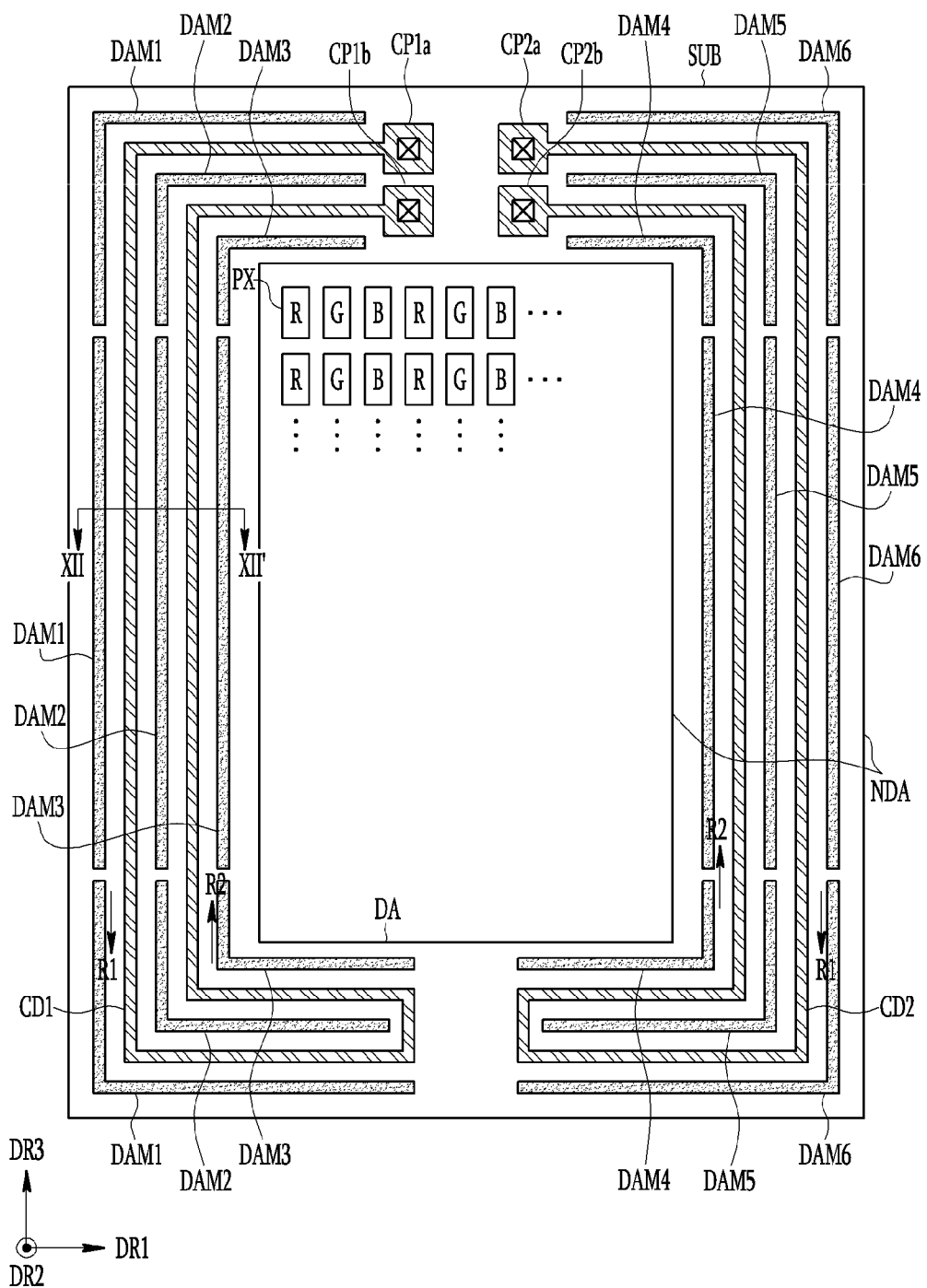
FIG. 12 is a top plan view schematically illustrating a fourth embodiment of a display device of the invention illustrating dams to prevent cracks from propagating in the device.

FIG. 12 is a top plan view schematically illustrating a fourth embodiment of a display device of the invention illustrating dams to prevent cracks from propagating in the device. FIG. 13 is a cross-sectional view taken along lines XII-XII' of FIG. 12. Particularly, XII-XII' portion in FIG. 13 shows a cross-section taken along the line XII-XII' of FIG. 12.

Dams may be disposed at opposite sides of first crack-sensing lines CD1 or between the first crack-sensing lines CD1 to help prevent propagation of cracks. The dams may not be electrically connected to other components of the display device and/or may not be connected to each other. A first dam DAM1 may be disposed at a left side of the first crack-sensing lines CD1, a second dam DAM2 may be disposed between the first crack-sensing lines CD1, and a third dam DAM3 may be disposed at a right side of the first crack-sensing lines CD1.

The first dam DAM1, the second dam DAM2, and the third dam DAM3 may be disposed on the first insulating layer IL1.

The first dam DAM1, the second dam DAM2, and the third dam DAM3 may be disposed along the first crack-sensing lines CD1 to surround a left edge of the display area DA. Each of the first dam DAM1, the second dam DAM2, and the third dam DAM3 may be parallel to the first crack-sensing lines CD1. The first dam DAM1, the second dam DAM2, or the third dam DAM3 may include a same material as that of the gate electrode GE. For example, the first dam DAM1, the second dam DAM2, or the third dam DAM3 may include copper (Cu). The first dam DAM1, the second dam DAM2, or the third dam DAM3 may be formed by using a same material as that of the gate electrode GE together when it is formed.

Similarly, dams may be disposed at opposite sides of the second crack-sensing lines CD2 or between the second crack-sensing lines CD2. A fourth dam DAM4 may be disposed at a left side of the second crack-sensing lines CD2, a fifth dam DAM5 may be disposed between the second crack-sensing lines CD2, and a sixth dam DAM6 may be disposed at a right side of the second crack-sensing lines CD2. The fourth dam DAM4, the fifth dam DAM5, and the sixth dam DAM6 may be disposed on the first insulating layer IL1.

The fourth dam DAM4, the fifth dam DAM5, and the sixth dam DAM6 may be disposed along the second crack-sensing lines CD2 to surround a right edge of the display area DA. Each of the fourth dam DAM4, the fifth dam DAM5, and the sixth dam DAM6 may be parallel to the first crack-sensing lines CD2. The fourth dam DAM4, the fifth dam DAM5, or the sixth dam DAM6 DAM3 may include a same material as that of the gate electrode GE, such as copper (Cu). The fourth dam DAM4, the fifth dam DAM5, or the sixth dam DAM6 may be formed by using the same material as that of the gate electrode GE together when it is formed.

Figure 13:
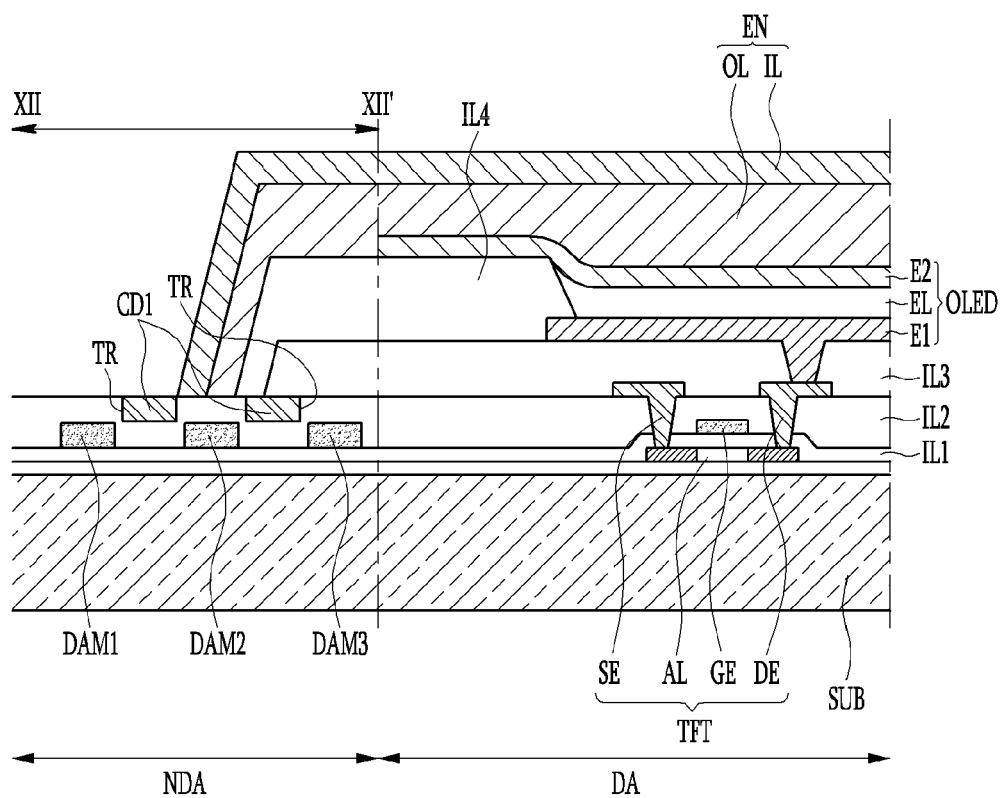
FIG. 13 is a cross-sectional view taken along lines XII-XII' of FIG. 12.
Figure 13:
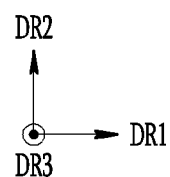

Although FIG. 13 illustrates an example in which the dams are disposed on the first insulating layer IL1, one or more of the dams may be disposed on the second insulating layer IL2. In this case, the dams may be formed by using the same material as that of the source electrode SE or the drain electrode DE. Further, although gaps are formed between the dams in FIG. 13, one dam may be formed without gaps. One or more of the first dam DAM1, the second dam DAM2, the third dam DAM3, the fourth dam DAM4, the fifth dam DAM5, and the sixth dam DAM6 may be omitted, and each of the first dam DAM1, the second dam DAM2, the third dam DAM3, the fourth dam DAM4, the fifth dam DAM5, and the sixth dam DAM6 may be provided without gaps. That is, the display device may include one or more dams, and the number of the dams may be greater than six. The design of the dams may be changed depending on the design of the crack-sensing lines such that the dams are substantially parallel to the crack-sensing lines. In addition, the both dams of FIGS. 12-13 and the protection lines of FIGS. 10-11 may be provided in a display device.

The dams may serve to prevent the cracks generated in the display device from being transferred to the display area DA, and thus it is possible to provide a display device that is stronger against cracks.

Although certain exemplary embodiments and implementations have been described herein, other embodiments and modifications will be apparent from this description. Accordingly, the inventive concepts are not limited to such embodiments, but rather to the broader scope of the presented claims and various obvious modifications and equivalent arrangements.

What is claimed is:

1. A display device comprising:
   a substrate including a display area in which a plurality of pixels are disposed, and a non-display area surrounding the display area;
   an insulating layer disposed over the display area and the non-display area and having a recess, the recess being disposed in and extending along the non-display area;
   a crack-sensing line disposed in and extending along the recess, and being electrically connected to at least one of the pixels; and
   a switching element to electrically connect the crack-sensing line to the at least one of the pixels.

2. The display device of claim 1, wherein the recess has a quadrangular cross-sectional shape.

3. The display device of claim 1, wherein the recess includes a polygonal or curved protrusion.

4. The display device of claim 1, wherein the recess comprises a trench having a ditch-like shape.

5. The display device of claim 1, further comprising first lines and second lines, wherein:
   the pixels are arranged in a matrix having a row direction and a column direction;
   the first lines are connected to first pixels arranged in the row direction;
   the second lines are connected to second pixels arranged in the column direction; and
   the crack-sensing line is electrically connected to at least one of the first pixels and the second pixels.

6. The display device of claim 3, wherein the crack-sensing line has a polygonal recess portion corresponding to the polygonal protrusion or a curved recess portion corresponding to the curved protrusion.

7. The display device of claim 1, wherein each of the pixels includes one or more thin film transistors,
   each thin film transistor includes a gate electrode as a control terminal, a source electrode as an input terminal, an active layer as a channel unit, and a drain electrode as an output terminal, and
   the crack-sensing line comprises a same material as that of at least one of the gate electrode, the source electrode, and the drain electrode.

8. The display device of claim 7, further comprising a plurality of gate lines and a plurality of data lines intersecting each other,
   wherein the crack-sensing line is connected to at least one of the gate lines and the data lines.

9. The display device of claim 7, wherein the insulating layer extends into the display area,
   at least one of the gate electrode, the source electrode, and the drain electrode is disposed in an electrode recess positioned in the insulating layer, and
   the electrode recess is positioned at a surface or inside of the insulating layer, and is positioned in the display area.

10. The display device of claim 1, further comprising
    at least one protection line disposed adjacent to the crack-sensing line,
    wherein the protection line is disposed in a protection line recess positioned in the insulating layer.

11. The display device of claim 10, wherein the protection line recess is positioned at a surface or inside of the insulating layer, and extends along the recess in the non-display area, and
    the protection line extends along the recess.

12. The display device of claim 10, wherein the protection line extends substantially parallel to the crack-sensing line.

13. The display device of claim 10, wherein each of the pixels includes one or more thin film transistors,
    each thin film transistor includes a gate electrode as a control terminal, a source electrode as an input terminal, an active layer as a channel unit, and a drain electrode as an output terminal, and
    the protection line comprises a same material as that of at least one of the gate electrode, the source electrode, and the drain electrode.

14. The display device of claim 10, wherein the at least one protection line is electrically isolated.

15. The display device of claim 1, further comprising at least one dam adjacent to the crack-sensing line, wherein the dam is disposed at a surface or inside of the insulating layer.

16. The display device of claim 15, wherein the dam extends substantially parallel to the crack-sensing line.

17. The display device of claim 15, wherein each of the pixels includes one or more thin film transistors,
    wherein each thin film transistor includes a gate electrode as a control terminal, a source electrode as an input terminal, an active layer as a channel unit, and a drain electrode as an output terminal, and
    wherein the dam comprises a same material as that of at least one of the gate electrode, the source electrode, and the drain electrode.

18. The display device of claim 17, wherein the dam comprises a plurality of dams disposed at opposite sides of the crack-sensing line.

19. The display device of claim 17, wherein the crack-sensing line comprises a plurality of crack-sensing lines, and the at least one dam is disposed between the crack-sensing lines.

20. The display device of claim 17, wherein the at least one dam is electrically isolated.

* * * * *